(12) United States Patent
Kim

(10) Patent No.: US 10,128,584 B2
(45) Date of Patent: Nov. 13, 2018

(54) ELASTIC ELECTRIC CONTACT TERMINAL WITH IMPROVED ENVIRONMENTAL RESISTANCE AND FABRICATION METHOD THEREFOR

(71) Applicants: JOINSET CO., LTD., Ansan-si, Gyeonggi-do (KR); Sun-Ki Kim, Gunpo-si, Gyeonggi-do (KR)

(72) Inventor: Sun-Ki Kim, Gunpo-si (KR)

(73) Assignee: JOINSET CO., LTD. & SUN-KI KIM (KR)

( * ) Notice: Subject to any disclaimer, the term of this patent is extended or adjusted under 35 U.S.C. 154(b) by 0 days.

(21) Appl. No.: 15/463,509

(22) Filed: Mar. 20, 2017

(65) Prior Publication Data
US 2017/0229795 A1    Aug. 10, 2017

Related U.S. Application Data

(63) Continuation of application No. PCT/KR2015/006956, filed on Jul. 6, 2015.

(30) Foreign Application Priority Data

Mar. 23, 2015    (KR) .................. 10-2015-0040000
May 28, 2015    (KR) .................. 10-2015-0075063

(51) Int. Cl.
*H01R 4/58*    (2006.01)
*H01R 4/62*    (2006.01)
(Continued)

(52) U.S. Cl.
CPC ............... *H01R 4/625* (2013.01); *H01R 4/58* (2013.01); *H01R 11/01* (2013.01); *H01R 12/57* (2013.01);
(Continued)

(58) Field of Classification Search
CPC .......... H01R 4/58; H01R 12/00; H01R 12/57; H01R 13/03; H01R 13/24; H01R 13/2414; H01R 13/6584; H01B 5/00
(Continued)

(56) References Cited

U.S. PATENT DOCUMENTS 4,857,668 A * 8/1989 Buonanno ............ H05K 9/0015
174/354
6,653,556 B2 * 11/2003 Kim ..................... H05K 9/0015
174/358
(Continued)

FOREIGN PATENT DOCUMENTS

JP    2011-086557 A    4/2011
KR    20-0390440 Y1    7/2005
(Continued)

OTHER PUBLICATIONS

International Search Report (PCT/KR2015/006956), WIPO, dated Dec. 22, 2015.
(Continued)

*Primary Examiner* — Xiaoliang Chen
(74) *Attorney, Agent, or Firm* — Park & Associates IP Law, P.C.

(57) ABSTRACT

Disclosed is an elastic electric contact terminal comprising: an elastic core; a polymer film which is bonded while covering the core, with an adhesive layer being interposed therebetween; and a copper foil capable of being soldered, which is bonded while covering the polymer film. A metal plating layer is formed on every surface exposed outwardly from the copper foil.

15 Claims, 6 Drawing Sheets

(51) Int. Cl.
*H01R 12/57* (2011.01)
*H01R 43/00* (2006.01)
*H05K 1/11* (2006.01)
*H05K 3/34* (2006.01)
*H01R 11/01* (2006.01)
*H01R 13/6584* (2011.01)
*H01R 13/24* (2006.01)

(52) U.S. Cl.
CPC ......... *H01R 13/24* (2013.01); *H01R 13/6584* (2013.01); *H01R 43/007* (2013.01); *H05K 1/11* (2013.01); *H05K 3/34* (2013.01); *H01R 13/2414* (2013.01); *H05K 3/3431* (2013.01); *H05K 2201/1031* (2013.01); *Y02P 70/611* (2015.11)

(58) Field of Classification Search
USPC ..... 174/261, 68.1, 120 AR, 126.2, 254, 255; 439/66, 78, 83
See application file for complete search history.

(56) References Cited

U.S. PATENT DOCUMENTS

| | | | | |
|---|---|---|---|---|
| 7,402,761 B2* | 7/2008 | Kim | ..................... | H05K 9/0015 174/356 |
| 7,771,213 B2* | 8/2010 | Kim | ................... | H01R 13/2414 439/83 |
| 7,931,475 B2* | 4/2011 | Kim | ....................... | H01R 12/57 439/66 |
| 8,461,455 B2* | 6/2013 | Kim | ................... | H01R 13/2414 174/126.2 |
| 8,853,536 B2* | 10/2014 | Kim | ....................... | H01R 13/03 174/120 AR |
| 2009/0227127 A1* | 9/2009 | Kim | ....................... | H01R 12/57 439/78 |
| 2011/0266031 A1* | 11/2011 | Kim | ................... | H01R 13/2414 174/126.2 |
| 2012/0322279 A1* | 12/2012 | Kim | ....................... | H01R 13/03 439/83 |

FOREIGN PATENT DOCUMENTS

| | | |
|---|---|---|
| KR | 10-0783588 B1 | 12/2007 |
| KR | 10-2010-0068814 A | 6/2010 |
| KR | 10-1001354 B1 | 12/2010 |
| KR | 10-1201410 B1 | 11/2012 |
| KR | 10-2015-0020043 A | 2/2015 |

OTHER PUBLICATIONS

Korean Office Action (KR 10-2015-0075063), KIPO, dated Jul. 20, 2016.

* cited by examiner

ELASTIC ELECTRIC CONTACT TERMINAL WITH IMPROVED ENVIRONMENTAL RESISTANCE AND FABRICATION METHOD THEREFOR

REFERENCE TO RELATED APPLICATIONS

This is a continuation of International Patent Application PCT/KR2015/006956 filed on Jul. 6, 2015, which designates the United States and claims priority of Korean Patent Application No. 10-2015-0040000 filed on Mar. 23, 2015, and Korean Patent Application No. 10-2015-0075063 filed on May 28, 2015, the entire contents of which are incorporated herein by reference.

FIELD OF THE INVENTION

The present invention relates to an elastic electric contact terminal, and more particularly, to an elastic electric contact terminal which is less corrosive and of which the environmental resistance is improved and the soldering strength is reliably improved.

BACKGROUND OF THE INVENTION

Typically, an elastic electric contact terminal on which soldering is possibly performed is required to have a good electric conductivity, a good elastic recovery force, and a high tolerance to a soldering temperature.

As an example of the elastic electric contact terminal, Korean Patent No. 783588 registered by the present applicant discloses a solderable elastic electric contact terminal including: an insulation foam rubber having a constant volume; an insulation non-foaming adhesive layer adhered to wrap the insulation foam rubber; and a heat-resistant polymer of which one side is adhered to wrap the insulation non-foaming adhesive layer and the other side on which a metal layer is integrally formed.

In addition, Korean Patent No. 1001354 discloses a reflow solderable elastic electric contact terminal including: an insulation elastic heat-resistant rubber core in which a penetration hole is formed in a longitudinal direction; an insulation heat-resistant adhesive layer adhered to wrap the insulation heat-resistant rubber core; and a heat-resistant polymer film of which one side is adhered to wrap the insulation heat-resistant adhesive layer and the other side has an integrally formed metal layer, wherein the heat-resistant polymer film is adhered to the insulation heat-resistant adhesive layer such that both ends are separated and a bottom surface of the insulation elastic heat-resistant rubber core is obliquely formed in a shape that both ends in a transverse direction is grooved toward a central part.

In the above-described process of fabricating the electric contact terminal, a rolled silicon rubber is provided, a liquid silicon rubber adhesive is consecutively placed thereon in a longitudinal direction of the silicon rubber, a polymer film in which a metal layer is formed is wrapped to expose the metal layer outside on the liquid silicon rubber adhesive, and then the silicon rubber adhesive is cured to adhere to the polymer film. Then the resultant is cut to a uniform length of, for example, 500 mm and cut again in a length of, for example, 3 mm required by a customer. Thereafter the resultant product plated with a metal is reel-taped.

Here, the metal layer is formed by plating a copper foil with tin or silver or plating a copper foil with nickel and then with tin or gold thereon, and the thickness of the copper foil is about 0.01 mm, which is significantly thicker than that of tin, silver, nickel or gold.

In this way, a metal plating layer of which environmental resistance is better than that of copper is formed on a copper foil of an existing contact terminal such that corrosion is prevented and soldering with a solder cream is well performed, but during a process for fabricating the contact terminal, the contact terminal is cut off to a length required by a customer. Therefore, the copper foil is only to be exposed outside at a cross section formed on a side in a longitudinal direction of the contact terminal.

In other words, since an existing contact terminal is made by wrapping a core in a polymer film having a copper foil plated with a metal layer such as tin and then is cut off, the copper foil is only to be exposed outside at the cross section.

As a result, there occurs a limitation in that the contact terminal may not pass a reliability test such as a saltwater spray test, since saltwater contacts the externally exposed copper foil to corrode the contact terminal, or in that the externally exposed copper foil is easily rusted to result in quality degradation.

In addition, there is a shortcoming that when the contact terminal is reflow-soldered to be mounted on a circuit board, since the copper foil is exposed at an externally exposed cross section, a lead-rising phenomenon occurs less on the copper foil than on the metal plating layer, which results in a less strong soldering strength at the cross section.

In addition, since the copper foil wrapping and adhering to the polymer film is bended at both bottom ends of the core, the bended copper foil always receives an elastic recovery force caused by an attempt to return to an original position, although the magnitude is small. There is also a limitation in that when the contact terminal is mounted on a circuit board by reflow-soldering, the melted soldering cream is applied to the copper foil to pull the copper foil downward and the pulling force is added to the elastic recovery force of the copper foil itself, thereby both ends of the polymer film being detached from the core or the adhesive.

Similarly, it is highly possible that both end parts of the polymer film are lifted and detached from the core or the adhesive before the adhesion is completed, when the polymer film and core are adhered with the adhesive in a making process.

SUMMARY OF THE INVENTION

An object of the present invention is to provide an elastic electric contact terminal which is robust against corrosion.

Another object of the present invention is to provide an elastic electric contact terminal of which a soldering strength is improved and soldering reliability is improved.

A further another object of the present invention is to provide an elastic electric contact terminal having a soldering strength capable of strongly resisting against a laterally applied external force.

A still further another object is to provide an elastic electric contact terminal capable of minimizing detachment of both ends of the polymer film during a making process or after soldering.

According to an aspect of the present invention, there is provided an elastic electric contact terminal including: an elastic core; a polymer film wrapping and adhering to the core with an adhesive layer intervened therebetween; and a solderable copper foil wrapping and adhering to the polymer film, wherein a metal plating layer is formed on all surfaces exposed outside the copper foil.

Preferably, a specific gravity of the electric contact terminal may be smaller than that of water.

Preferably, the metal plating layer may be formed by plating with tin (Sn) or silver (Ag), or by plating with tin (Sn) or gold (Au) after plating with nickel (Ni).

Preferably, the metal plating layer may have less corrosiveness than the copper foil.

Preferably, the copper foil may be thicker than the metal plating layer.

Preferably, the copper foil may be an electrolytic copper foil or a rolled copper foil, and adheres to the polymer film by coating, on the copper foil, and curing a liquid polymer corresponding to the polymer film, or adheres to the polymer film with an adhesive intervened therebetween.

Preferably, soldering may be performed easier on the metal plating layer than on the copper foil at a time of the soldering.

Preferably, the elastic core may be a silicon rubber in a tube type or foam type, the adhesive layer may be a silicon rubber adhesive layer, and the polymer film may be polyimide (PI).

Preferably, the metal plating layer may be formed by electroless plating to increase a surface roughness, and thus a soldering strength may be enhanced.

Preferably, the electric contact terminal may have a width longer than a length.

Preferably, the electric contact terminal may be soldered to a conductive pattern of a circuit board with a solder cream and may be elastically electrically connected to a facing electrical conductive object.

Preferably, the exposed surfaces may include a surface and both sections in a transverse direction of the copper foil, and a cross section of the copper foil, which may be formed by cutting the electric contact terminal.

Preferably, the metal layer may be removed by a prescribed part from both ends of the polymer film at a bottom surface of the core and exposed externally.

Preferably, the metal layer may be removed by a prescribed width in a transverse direction and consecutively in a longitudinal direction from the both ends of the polymer film at the bottom surface of the core.

Preferably, the metal layer may be formed by lithographing and etching.

Preferably, the core may be formed caved downward in a prescribed width and depth from a top surface, and may include at least one channel extending along a longitudinal direction.

Preferably, the polymer film may cross the channel to extend over the both sidewalls or closely adhere to an outer surface of the core, and the both sidewalls of the channel elastically may support the object.

Preferably, the channel may be formed in plurality and a support wall protruding between the channels to a height corresponding to the both sidewalls and extending in the longitudinal direction is further included.

Preferably, a top surface of the support wall may adhere to the polymer film with the adhesive layer intervened therebetween.

Preferably, a side surface of a channel side of the both sidewalls may have a slope and the both sidewalls may tilt toward the channel side at a time of being pressurized by the object.

According to another aspect of the present invention, there is provided an elastic electric contact terminal including: an elastic core; a polymer film wrapping and adhering to the core with an adhesive layer intervened therebetween; and a solderable metal layer wrapping and adhering to the polymer film, wherein the metal layer includes a copper plating layer formed by plating after a metal seed is sputtered on the polymer film, and the metal plating layer is formed to cover a surface and both sections in a transverse direction of the copper plating layer, and a cross section of the copper plating layer formed by cutting the electric contact terminal.

According to still another aspect of the present invention, there is provided a method for making an elastic electric contact terminal, the method including: providing a rolled silicon rubber; consecutively coating a liquid silicon rubber adhesive in a longitudinal direction of the silicon rubber; wrapping the silicon rubber with one surface of a polymer film with the liquid silicon rubber adhesive intervened therebetween and another surface of the polymer film adhered to by a copper foil, and curing the silicon rubber adhesive to make the polymer film adhere to the silicon rubber and to form a laminated body; cutting the laminated body to a prescribed length; and plating, with a metal, a surface and both sections in a transverse direction of the copper foil and a cross section of the copper foil, which is formed by the cutting, and forming a metal plating layer.

BRIEF DESCRIPTION OF THE DRAWINGS

The above objects and other advantages of the present invention will become more apparent by describing in detail exemplary embodiments thereof with reference to the attached drawings in which.

DETAILED DESCRIPTION OF THE INVENTION

Hereinafter, specific embodiments will be described in detail with reference to the accompanying drawings.

Figure 1:
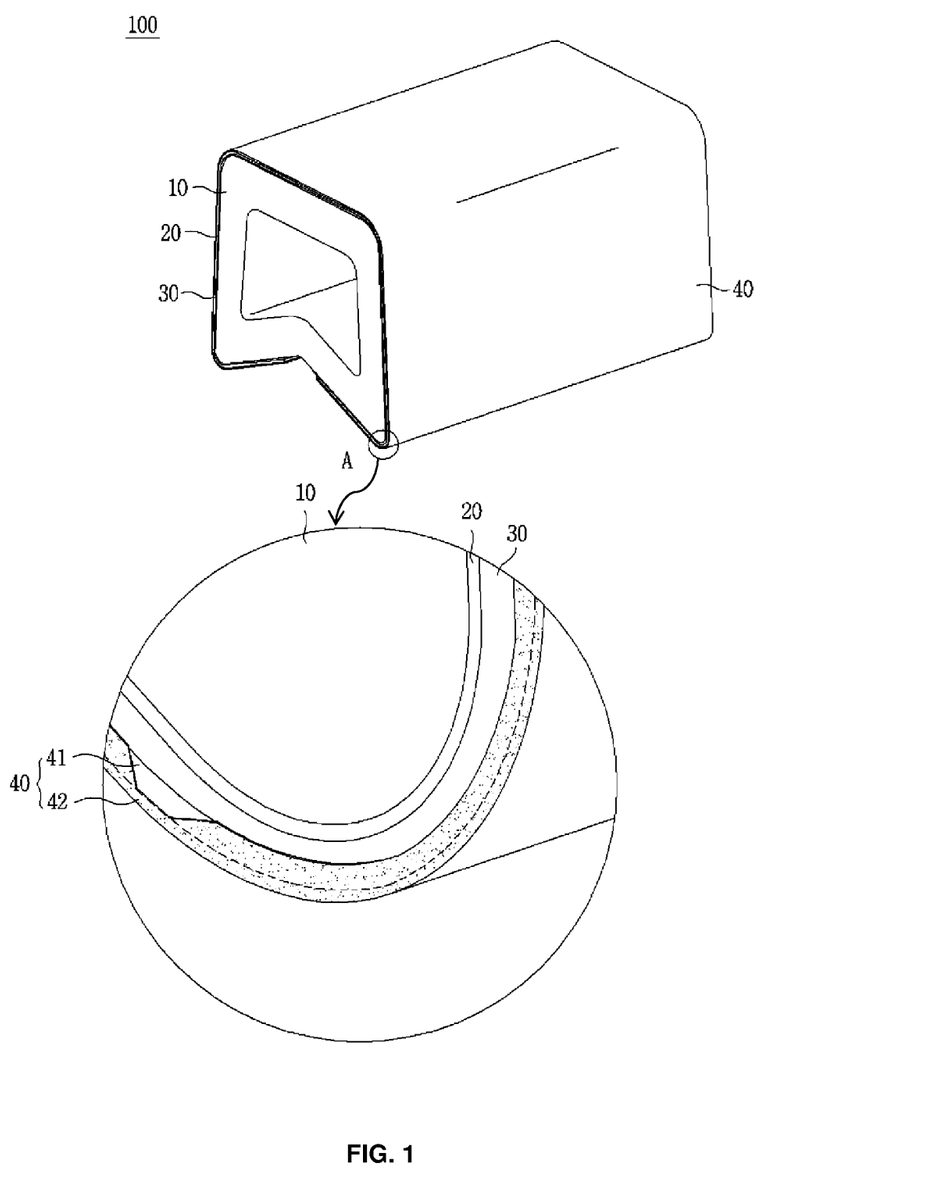
FIG. 1 illustrates an electric contact terminal according to an embodiment of the present invention.

FIG. 1 illustrates embodiment of an electric contacting terminal according to an embodiment of the present invention.

An elastic electric contact terminal 100 is formed in which a core 10, an adhesive layer 20, a polymer film 30, and a metal layer 40 are sequentially laminated.

The electric contact terminal 100 is interposed between a circuit board and an electroconductive object to electrically connect therebetween, and may be installed by being forcibly inserted between a conductive pattern of the circuit board and the electroconductive object or be soldered with a solder cream to the conductive pattern of the circuit board to contact a facing electroconductive object.

For a reflow soldering, the electric contact terminal 100 is reel-taped to a carrier and reflow-soldered using vacuum pick-up and a solder cream.

1.1 Core 10

The core 10 of a rubber material has heat resistance and elasticity and may be electrically insulated. Consequently, the core 10 may be formed of a non-foaming silicon rubber or a foam rubber, for example, a sponge, which has a tube shape and satisfies reflow-soldering and an elastic condition, but is not limited thereto.

The core 10 may be made by, for example, an extrusion process and is formed symmetrically to be balanced in a horizontal direction at the time of soldering to reduce lifting or deviation phenomenon at the time of reflow-soldering with a solder cream.

By providing a plane for vacuum pick-up to a top surface of the core 10 and forming respectively both side corners of the top surface in a round shape, it is not only easy to handle but also able to prevent the electric contact terminal 100 from being stuck at the both corners in a process that the completed electric contact terminal 100 is assembled with a facing object after being soldered to a printed circuit board etc.

The core 10 may have a shape that one or more penetration holes are formed in the tube or inside in a longitudinal direction, or may not have a penetration hole like a sponge.

The thicknesses of both sidewalls of the penetration hole of the core 10 may be formed thinner than those of upper and lower sidewalls to have good elasticity and to make a user exert less force to press.

On the other hand, when a cross section of the core 10 has a tube shape or a shape with a penetration hole therein, if the height of the electric contact terminal 100 is equal to or smaller than 0.5 mm, it is hard to form the penetration hole and to make the shape in a tube type, and a making efficiency is also degraded.

Figure 2A:
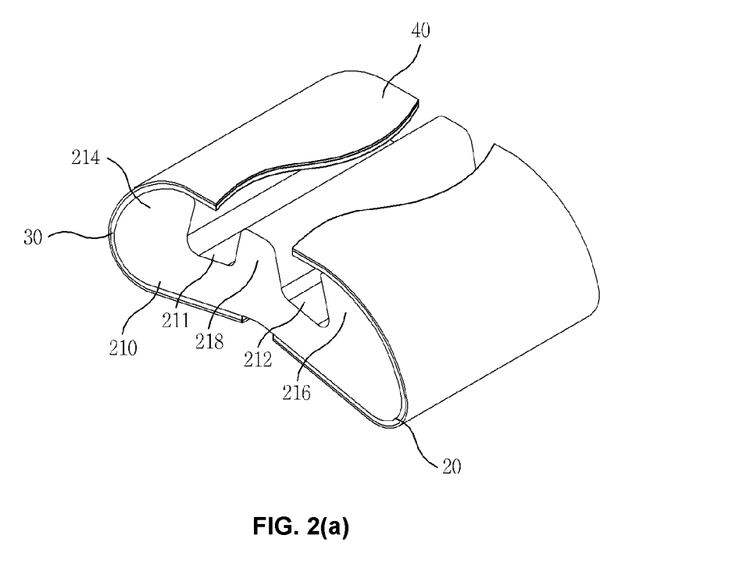
FIGS. 2(a) and 2(b) show modification examples of a core.
Figure 2B:
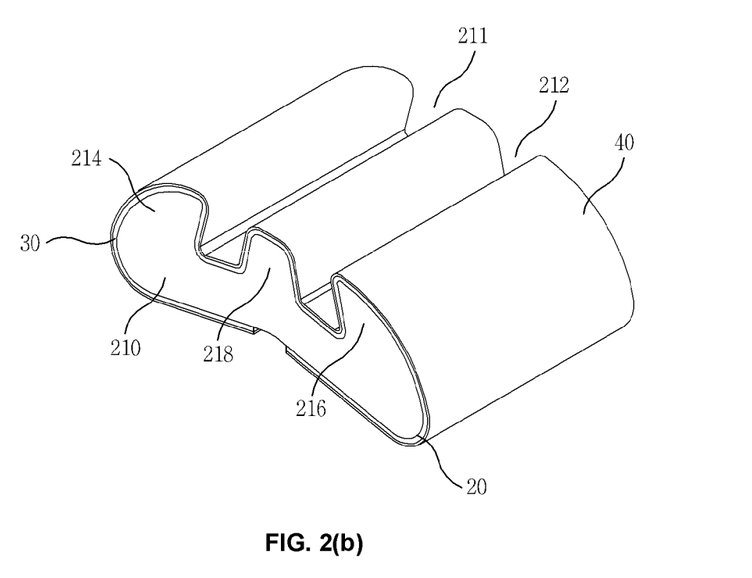

FIGS. 2(*a*) and 2(*b*) show modification examples of a core.

In the core 110, a pair of channels 211 and 212 caved in downward from the top surface and having a constant width and depth are formed apart and extend along a longitudinal direction, and as a result, a support wall 218 is formed at the approximately same height as that of the sidewalls 214 and 216 between the channels 211 and 212.

The bottoms of the channels 211 and 212 may be formed to have slopes similarly to the bottom surface of the core 210 and have upward slopes from outer bottom corners toward inner sides.

According to the above-described structure, the sidewalls 214 and 216 are respectively formed in the outsides of the channels 211 and 212 and the support wall 218 is formed therein and accordingly, an object to be pressed upward is supported by the sidewalls 214 and 216 and the support wall 218.

The cross section shape of the support wall 218 is not particularly limited, but may be, for example, a trapezoidal shape that becomes smaller as proceeding toward the top surface and both corners of the top surface may be formed round.

As the above-described embodiment, the both sidewalls 214 and 216 may be formed in a shape that outer sides of the top surface are round-treated, and this allows a completed electric contact terminal to be easily pressed inside, when being pressed by a facing object after being soldered to a printed circuit board, etc., and prevents an external object from being stuck to both side corners.

In this embodiment, although an example of forming the pair of channels 211 and 212 is presented, a single channel may be formed and a separate support wall may not be formed. On the contrary, multiple channels may be formed and in this case, multiple support walls 218 may be formed between the channels.

The core 210 is formed in a small size of, for example, the width of 2 mm, the height of 0.5 mm, and the length of 1 mm, but is not limited thereto and has a size equal to or smaller than that.

As described above, for the core 210 of such a size, when forming a penetration hole therein as usual or making a core 210 itself in a tube shape, it is hard to make the height equal to or smaller than 0.7 mm. However in this embodiment, an electric contact terminal in which the height is equal to or smaller than 0.5 mm may be easily made, since the core 210 is caved downward from the top surface to form the channels 211 and 212 having a constant width and depth and extending in a longitudinal direction.

Side surfaces of the both sidewalls 214 and 216 in a side of the channels 211 and 212, namely, inner side surfaces are made to be tilted toward the side of the channels 211 and 212 and accordingly the both sidewalls 214 and 216 are made to be easily tilted toward the side of the channels 211 and 212 to decrease a pressing force.

On the other hand, the polymer film 30 in which the metal layer 40 is laminated on the top surface may wrap the core 210 to span the both sidewalls 214 and 216 and the support wall 218 as shown in FIG. 2(*a*) or wrap the core 210 to closely adhere to an outer surface of the core 210 as shown in FIG. 2(*b*).

For FIG. 2(*a*), the top surface of the support wall 218 has an adhesive layer 220 intervened like other parts of the core 210 to adhere to the polymer film 230 and prevents the polymer film 230 from being lifted.

The bottom surface of the core 10 may be formed obliquely to be caved in from the both ends toward the central part in a transverse direction. In other words, the bottom surface of the core 10 may be formed obliquely to be caved in from both corners in the transverse direction toward the center part in order to form the hypotenuse of an isosceles triangle of the core 10 when the core 10 is vertically cut off.

The slope angle is not particularly limited but it is sufficient that a space is formed which accommodates an adhesive leaked out from the adhesive layer 20 at the bottom portion of the bottom surface of the core 10 and does not affect soldering.

According to such a structure, since the bottom surface of the core 10 has a shape to be caved in from the both ends toward the central part, both sides of the bottom surface of the electric contact terminal 100 may uniformly contact molten solder at the time of reflow-soldering to prevent a lifting phenomenon that only any one part of the bottom surface is soldered.

In addition, since the bottom surface of the core 10 has a shape caved in from the both ends toward the central part, a space capable of accommodating the adhesive leaked out externally from the adhesive layer 20 is provided to minimize a phenomenon that soldering is not performed at the time of reflow-soldering in the making process.

1.2 Adhesive Layer 20

The adhesive layer 20 has flexibility, elasticity, and insulation, and also may have heat resistance when the electric contact terminal 100 is applied to reflow-soldering, and may be located between the core 10 and the polymer film 30 to reliably adhere to the core 10 and the polymer film 30.

The adhesive layer 20 may be formed by thermal curing of, for example, a liquid silicon rubber, and the liquid silicon rubber adheres to a facing object while being cured and forms the adhesive layer 20 in a solid state after being cured. Once being cured, the adhesive layer 20 maintains elasticity, is not molten even when heat is applied again and maintains adhesion even at the time of soldering.

The adhesive layer 20 may be formed when a silicon rubber adhesive having self-adhesion is cured and the thickness thereof is about 0.005 mm to about 0.03 mm.

1.3 Polymer Film 30

The polymer film 30 may be, for example, a polyimide (PI) film having good heat resistance or another heat-resistant polymer film and the thickness thereof may be determined in consideration of flexibility or a mechanical strength.

The polymer film 30 is a typical polymer film used in a flexible circuit board having flexibility.

For example, the polymer film 30 may be formed by curing after a liquid polymer is cast and the thickness of the cured polymer film 30 is about 0.007 mm to 0.030 mm.

1.4 Metal Layer 40

The metal layer 40 is formed such that one surface thereof wraps and adheres to the polymer film 30 and a metal plating layer 42 is formed to cover a copper layer 41.

In other words, the metal plating layer 42 is formed on the entire exposed surface of the copper layer 41 and the exposed surface includes a surface of the copper layer 41, namely, a top surface, a side surface, and a bottom surface, and includes a cross section and both sections in a transverse direction.

Here, the copper layer 41 may be a copper foil of an electrolytic copper foil or a rolled copper foil, or typically indicate a copper plating layer formed on a resultant obtained after tungsten is sputtered as a seed onto one surface of the polymer film. Hereinafter the copper foil will be exemplified for convenience of explanation.

The thickness of the copper foil 41 is about 10 µm and the copper plating layer is thinly formed to have the thickness of about 3 µm.

It is necessary to take a notice that the metal plating layer 42 is less corrosive than the copper foil 41, and the copper foil 41 is thicker than the metal plating layer 42.

The copper foil 41 may adhere to the polymer film 30 with an adhesive intervened therebetween or may adhere by coating and curing a liquid polymer corresponding to the polymer film 30 on the copper foil 41 such that the metal layer 40 is formed to wrap and adhere to the polymer film 30.

The metal plating layer 42 is formed by plating with tin (Sn) or silver (Ag) or plating with nickel (Ni) and then with tin (Sn) or gold (Au) and the thickness of tin or silver may be about 2 µm and the thickness of nickel or gold is equal to or smaller than about 1 µm.

The metal plating layer 42 is formed such that corrosion of the surface of the copper foil 41 is prevented or the surface of the copper foil 41 is electrified and well soldered. According to this embodiment, as magnified and illustrated within a circle in FIG. 1, the metal plating layer 42 is formed on and covers the copper foil 41 exposed at the cross section of the contact terminal 100.

In FIG. 1, a boundary between the copper foil 41 and the metal plating layer 42 is denoted by a dotted line and the copper foil 41 is illustrated to be covered at the cross section by the metal plating layer 42.

Accordingly, since the copper foil is typically exposed externally at the cross section formed by a cutoff, the copper foil exposed in a reliability test like a saltwater spray test contacts saltwater to cause corrosion. Therefore, the copper foil does not pass the saltwater spray test or corrosion occurs on the exposed copper foil in use to result in reliability degradation.

However, according to the present invention, since the copper foil 41 exposed at the cross section is covered with the metal plating layer 42, the contact with the saltwater may be fundamentally blocked in the reliability test. In addition, since the copper foil 41 in use is not exposed, there is no concern about occurrence of corrosion and reliability is enhanced.

Furthermore, since the solder cream may spread better on the metal plating layer 42 formed to cover the copper foil 41 at the cross section at the time of reflow-soldering, the soldering strength may be increased and especially the soldering strength is enhanced at the cross section.

In particular, when the width of the contact terminal 100 is longer the length, the soldering strength at the cross section is very important and the present invention is very useful in this case.

In addition, since the metal plating layer 42 is not formed on the adhesive pressed out externally, an appearance of the electric contact terminal 100, in particular, the top surface and bottom surface may be easily discerned with the naked eye.

In order to make the electric contact terminal 100 according to the embodiment, the contact terminal bar is cut to a uniform length, for example, about 500 mm, when the contact terminal bar is provided by the polymer film 30, of which one side has the copper foil 41 adhering thereto, consecutively wrapping the core 10 with the liquid-phased adhesive layer 20 intervened therebetween.

Thereafter, the contact terminal bar is cut to a length desired by a customer, for example, about 3 mm to form a contact terminal and as described above, the final contact terminal 100 is made by forming the metal plating layer 42 plated with tin, silver, or nickel/gold to cover the exposed surface of the copper foil 41.

Here, the specific gravity of the contact terminal 100 is smaller than that of water due to the core 10 of a silicon rubber material, and thus the metal plating layer 42 may be formed using electroless plating in a bulk manner. However, the forming manner is not limited thereto and electrolytic plating may also be applied thereto.

In particular, when the metal plating layer 42 is formed by the electroless plating, the surface roughness of the metal plating layer 42 is increased to cause the surface to be rough, which enhances adhesion to the solder cream and increases the soldering strength.

As the above description, since the core 10 is made of a non-foaming silicon rubber or foam rubber, for example, sponge, the adhesive layer 20 is formed by thermal-curing a liquid silicon rubber, and the polymer film 30 is formed of a polyimide film, the metal plating layer 42 is not formed on the cross section by a plating process.

As the above description, for the electric contact terminal 100, the metal plating layer 42 is formed on all the externally exposed copper foil 41 including the surface, the cross section, and both sections in the transverse direction and the copper foil 41 is blocked from the outside.

Thereafter, a product in which the metal plating layer 42 is formed is automatically reel-taped on a carrier tape using a reel taping device.

In this way, since the electric contact terminal 100 of the present invention may fundamentally block contact from saltwater in the reliability test by covering all the copper foil 41 with the metal plating layer 42, there is no concern about occurrence of corrosion thereon, and the solder cream spreads well on the cross section to increase the soldering strength at the time of reflow soldering.

In particular, since the plating process is performed on the entire copper foil 41 exposed externally after the cutoff, the metal plating layer 42 is also formed on both sections in the transverse direction of the copper foil 41 positioned on the bottom surface of the core 10 and consequently the copper foil 41 is not exposed externally at all.

Figure 3:
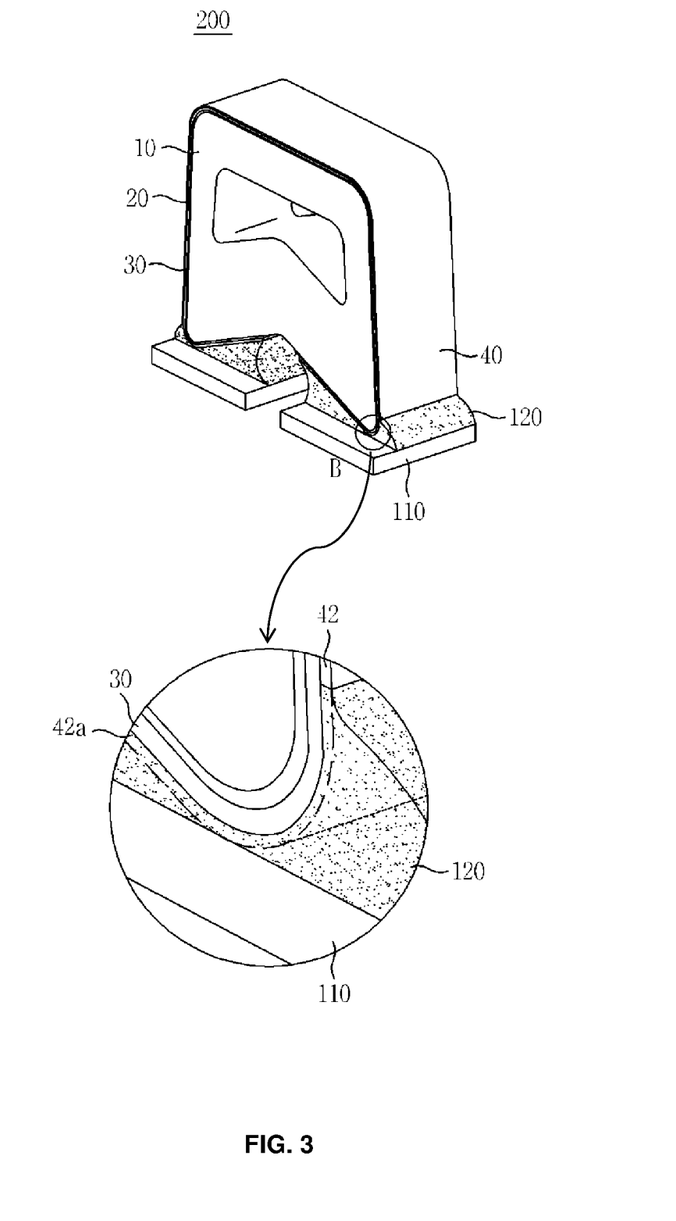
FIG. 3 illustrates a state where an electric contact terminal is soldered on a circuit board according to another embodiment of the present invention.

FIG. 3 illustrates a state where an electric contact terminal is soldered on a circuit board according to another embodiment of the present invention.

In this embodiment, an electric contact terminal 200 is disclosed of which the with of 2 mm is longer than the length of 1 mm.

As illustrated in a magnified circle of FIG. 3, the electric contact terminal 200 is soldered with the solder cream 120 intervened on the conductive pattern 110 of the circuit board, and the solder cream 120 spreads along the side surface of the copper foil 41 and along a metal plating layer part 42a covering the copper foil 41 at the cross section of the contact terminal 200.

As a result, since the solder cream 120 extends along the metal plating layer part 42a covering the copper foil 41 at the cross section of the electric contact terminal 200, lead rising and solderability are enhanced and consequently a soldering strength is enhanced.

In particular, like this embodiment, for the electric contact terminal 200 of which the width is longer than the length, since an area occupied by the metal plating layer part 42a is increased as the width increases, reliability and performance of the electric contact terminal 200 are improved to increase the soldering strength at the time of reflow soldering as the lead-rising and solderability are enhanced.

Figure 4:
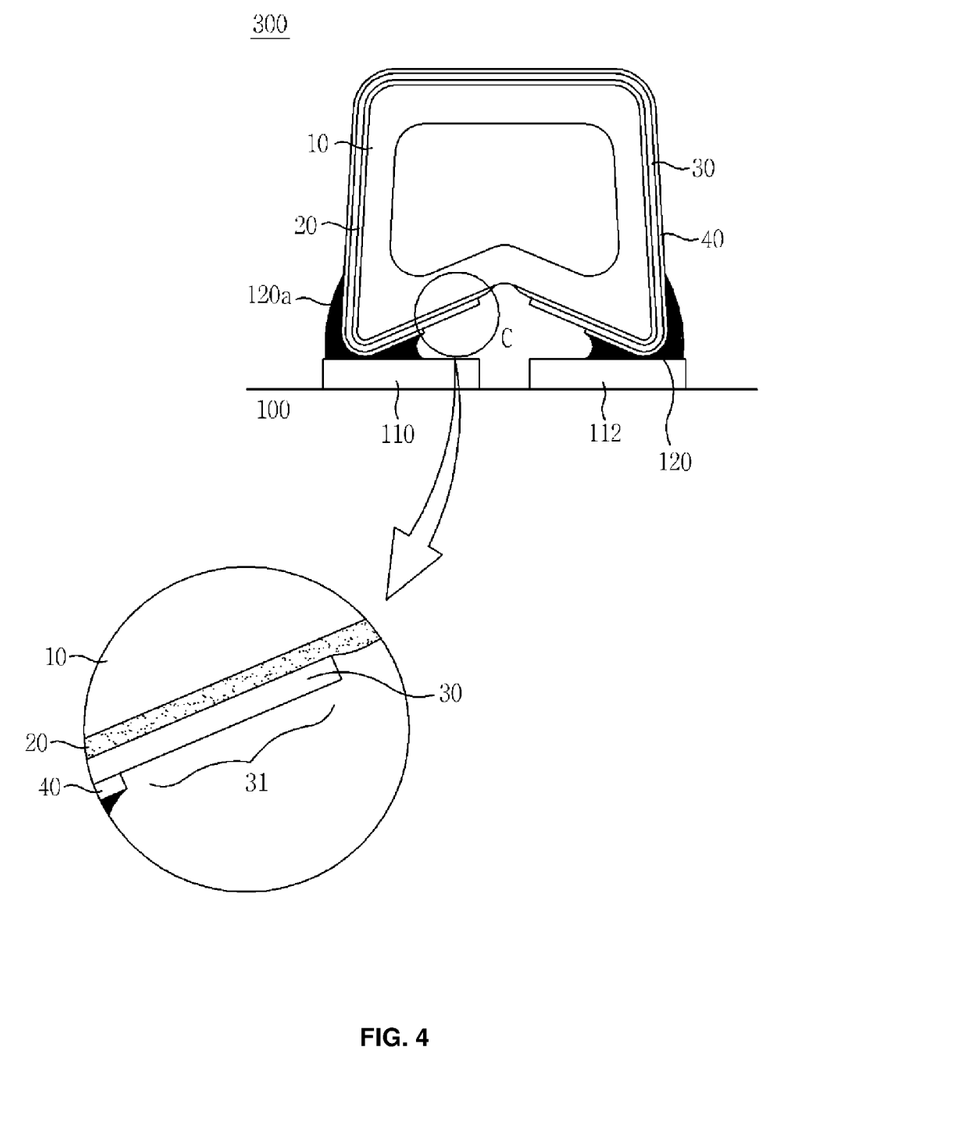
FIG. 4 illustrates an electric contact terminal according to another embodiment of the present invention.
Figure 5:
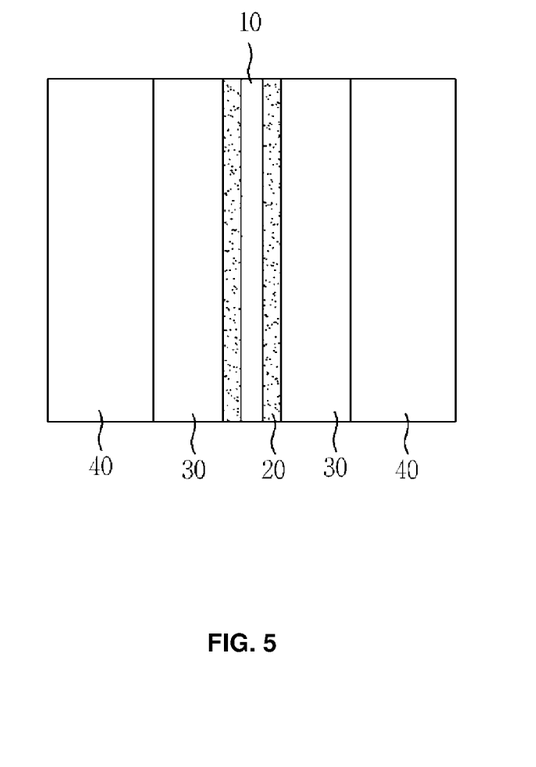
FIG. 5 illustrates a bottom surface of the electric contact terminal of FIG. 4.
Figure 6A:
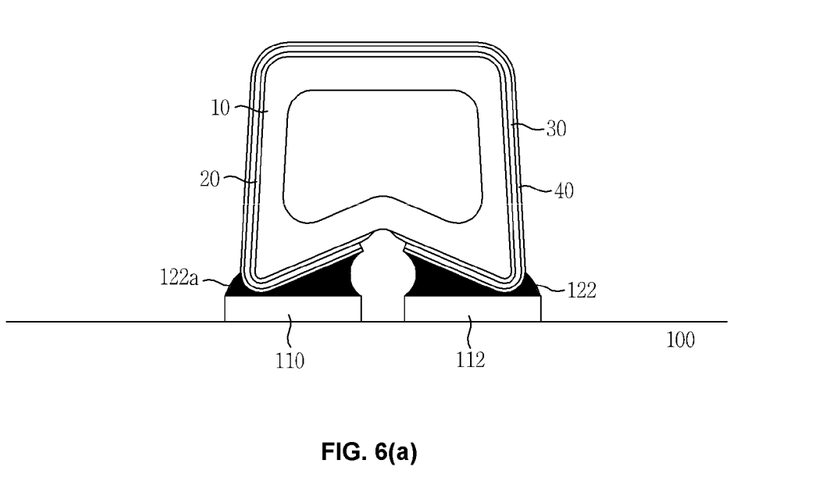
FIG. 6(a) illustrates an electric contact terminal mounted on a circuit board according to the present invention.
Figure 6B:
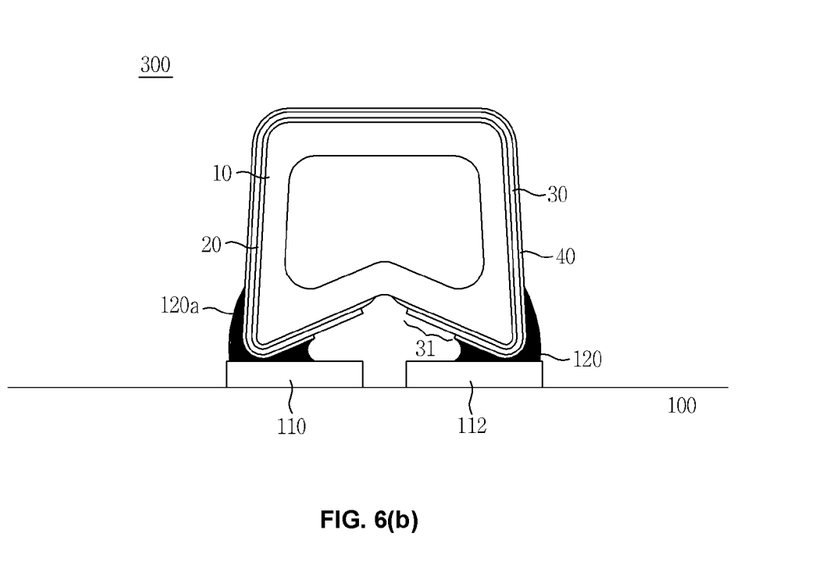
FIG. 6(b) illustrates a typical electric contact terminal mounted on a circuit board.

FIG. 4 illustrates an electric contact terminal according to another embodiment of the present invention, FIG. 5 illustrates the bottom surface of the electric contact terminal, FIG. 6(a) shows an electric contact terminal of the present invention mounted on a circuit board, and FIG. 6(b) shows a typical electric contact terminal mounted on a circuit board.

At the bottom surface of a contact terminal 300, the metal layer 40 is partially removed from both ends and a certain part 31 is exposed externally from both ends of the polymer film 30.

For example, the metal layer 40 may be removed to be exposed from the both ends of the polymer film 30 as much as a width of 0.05 mm to 0.3 mm, and the removed width of the metal layer 40 may be differed according to the width of the contact terminal 300. In other words, it should be considered that as the removed width of the metal layer 40 increases, a soldered area becomes relatively reduced and consequently decrease the soldering strength.

In other words, from views of FIG. 5 and an inside of a magnified circle of C in FIG. 4, the metal layer 40 is removed from both ends of the polymer film 30 by a certain length in a transverse direction and consecutively in a longitudinal direction, and then the polymer film 30 is exposed externally.

According to such a configuration, since the area of the metal layer 40 formed on the bottom surface of the contact terminal 300 is decreased, when an identical amount of the solder cream is applied in an identical solder pattern to the contact terminal 300 of an identical configuration, an amount of a molten solder cream spreading along the metal layer 40 on the bottom surface of the contact terminal 300 is decreased. Therefore, the molten solder cream spreads relatively greatly along a side surface and consequently a solder fillet 120a may be formed to a higher position to reliably support the side surface of the contact terminal 300 after soldering. As a result, the contact terminal 300 may strongly respond to a force applied thereto from a later direction.

In addition, since both end portions of the metal layer 40 are positioned at an inner side than both end portions of the polymer film 30, when the contact terminal 300 is made by curing after the elastic core 10 is wrapped with the polymer film 30 with a liquid polymer adhesive intervened therebetween, a tendency that the both end portions of the polymer film 30 are detached from the core 10 by an elastic recovery force of the metal layer 40 before the polymer adhesive is completely cured may be greatly reduced.

In addition, since an area to which the molten solder cream adheres is also decreased as an area occupied by the metal layer 40 bended toward the bottom surface of the contact terminal 300 is decreased, a force for pulling, by the molten solder cream, the copper foil 41 downward is also decreased to prevent the both end portions of the polymer film 30 from being detached and lifted from the core 10.

Furthermore, although an adhesive pressed out from the both end portions of the polymer film 30 by an external pressure caused by a mould flows along the polymer film 30, a step formed by the both end portions of the copper foil 41 may block the flow of the adhesive to enhance the soldering strength and to reduce a lifting phenomenon.

In addition, as the area occupied by the metal layer 40 bended toward the bottom surface of the contact terminal 300 is reduced, the area occupied by the solder cream on the bottom surface of the contact terminal 300 becomes reduced to consequently form a space having a relatively larger volume at the bottom surface of the contact terminal. Therefore, a force applied from the outside may be elastically received.

For the copper foil 41 forming the metal layer 40, a portion corresponding to a certain part 31 of the polymer film 30 may be removed by lithography and etching processes, for example, in a state where the copper foil 41 is formed on the polymer film 30.

After the copper foil 41 is removed, as the above-described embodiment, the metal plating layer 42 is formed by plating with tin or silver, or with tin or gold after nickel-plating on the copper foil 41.

Referring to FIG. 6(a), the molten solder cream spreads along the metal layer 40 wrapping the bottom surface and side surface of the contact terminal. Since both end portions of the polymer film 30 are identical to the both end portions of the metal layer 40 and the molten solder cream mainly spreads along the metal layer 40 formed at the bottom surface, solder fillets 122 and 122a having a relatively small size are formed at the side surface.

Accordingly, since not sufficiently responding to a force applied from a lateral direction, the contact terminal may be easily detached from conductive patterns 110 and 112. In addition, since the metal layer 40 on the bottom surface is pulled downward by the molten solder cream in the soldering process, both end portions of the polymer film 30 adhering to the core 10 become lifted and detached by a unique recovery force of the metal layer 40 and a pulling force by the molten solder cream.

On the other hand, from a view of FIG. 5(b) showing a soldered state of the electric contact terminal, since an area of the metal layer 40 formed by the certain portion 31 exposed externally from the both ends of the polymer 30 at the bottom surface of the contact terminal 300 is small, an identical amount of the molten solder cream 12 relatively further spreads along the side surface of the contact terminal 300 and as a result, the solder fillet 120a is formed to a higher position along the side surface of the contact terminal 300.

Accordingly, although a force is applied to the contact terminal 300 from a lateral direction, the solder fillet 120a formed on the side surface of the contact terminal 300 may sufficiently respond thereto and reduce detachment of the contact terminal 300 from the conductive patterns 110 and 112.

In addition, the metal layer 40 on the bottom surface is pulled downward by the solder cream molten at the time of soldering. Since the both end portions of the metal layer 40 are positioned at an inner side than the both end portions of the polymer film 30, a pulling force by the molten solder cream is reduced and an area of the metal layer 40 is reduced to decrease a unique elastic recovery force. At a result, a phenomenon that the both end portions of the polymer film 30 attached to the core 10 are pulled downward by the metal layer 40 and lifted to be detached may be prevented.

On the other hand, when the polymer film 30 coated with an adhesive wraps and adheres to the core 10 by pressing and thermal-curing while passing through a mould (not shown), although the adhesive pressed out from both ends of the polymer film 30 by an external pressure caused by the mould flows along the polymer film 30, the flow of the adhesive may be blocked, since the both end portions of the metal layer 40 form a step. Since such an adhesive is not soldered by the solder cream, this step consequently enhances the solder strength of the contact terminal to reduce the lifting phenomenon, etc.

In the above-described embodiment, although it has been exemplarily described that the electric contact terminal 100, 200 or 300 is soldered by the solder cream and contacts a facing electrical conductive object, the present invention is not limited thereto and like the above description, the electric contact terminal 100, 200 or 300 may be installed by being forcibly inserted between a conductive pattern and an electrical conductive object of the circuit board. In this case, since there is not a process such as reflow soldering, a material of an element is not necessary to have heat-resistance.

According to the above-described structure, a contact between saltwater and a copper foil may be basically blocked in a reliability test by covering the copper foil exposed at a cross section in a longitudinal direction with a metal plating layer having a good environmental resistance, and reliability is improved, since the copper foil in use is not exposed externally to remove a concern about rust.

In addition, a solder cream spreads well on a metal plating layer formed to cover the copper foil at the longitudinal cross section to result in an increase in soldering strength.

In addition, since a metal layer area formed on the bottom surface of the contact terminal is small, even if a typical amount of a solder cream is applied, a solder fillet may be formed to a relatively higher position of the contact terminal to resist against a force laterally applied to the contact terminal as a result.

In addition, since an area occupied by a metal layer bended toward the bottom surface of the contact terminal is reduced, an elastic recovery force is relatively reduced, a soldered area is also reduced, and both ends of the polymer film in a transverse direction may be prevented from being detached and lifted from the core or adhesive during an adhesive process or after soldering.

Furthermore, although an adhesive pressed out from both ends of the polymer film by an external pressure caused by a mould flows along the polymer film, a step formed by the thicknesses of both end parts may prevent the flow of the adhesive.

In addition, since an area occupied by a metal layer bended toward the bottom surface of the contact terminal is reduced, an area to which a solder adheres is also reduced, a space having a larger volume is formed in the bottom surface of the contact terminal, and this space acts as an additional buffer space to elastically accept an externally applied force.

Although embodiments have been described with reference to a number of illustrative embodiments thereof, it should be understood that numerous other modifications and embodiments can be devised by those skilled in the art. Various modifications, changes, alterations, and equivalent embodiments can be made without departing from the spirit and scope of the invention. The scope of the invention should be limited only by the accompanying claims.

What is claimed is:

1. An elastic electric contact terminal comprising:
   an elastic core;
   a polymer film surrounding and adhered to the core with an adhesive layer disposed therebetween;
   a solderable copper foil surrounding and adhered to the polymer film; and
   a metal plating layer surrounding and adhered on all of the exposed external surfaces of the copper foil,
   wherein a specific gravity of the electric contact terminal is smaller than that of water,
   wherein the exposed external surfaces surrounded by the metal plating layer include a top surface, a bottom surface, side surfaces, and opposing cut surfaces at two longitudinal end sections of the copper foil.

2. The elastic electric contact terminal of claim 1, wherein the metal plating layer is formed of materials selected from a group consisting of tin (Sn), silver (Aa), gold (Au), and nickel (Ni).

3. The elastic electric contact terminal of claim 1, wherein the metal plating layer has less corrosiveness than the copper foil.

4. The elastic electric contact terminal of claim 1, wherein the copper foil is thicker than the metal plating layer.

5. The elastic electric contact terminal of claim 1, wherein soldering is performed easier on the metal plating layer than on the copper foil at a time of the soldering.

6. The elastic electric contact terminal of claim 1, wherein the elastic core is a silicon rubber in a tube shape, the adhesive layer is a silicon rubber adhesive layer, and the polymer film is polyimide (PI) film.

7. The elastic electric contact terminal of claim 1, wherein the metal plating layer is formed by electroless plating to increase a surface roughness, and enhance a solderablility.

8. The elastic electric contact terminal of claim 1, wherein the electric contact terminal has a width longer than a length.

9. The elastic electric contact terminal of claim 1, wherein the electric contact terminal is soldered to a conductive pattern of a circuit board with a solder cream and is elastically electrically connected to a facing electrical conductive object.

10. The elastic electric contact terminal of claim 1, wherein the metal layer is formed by lithographing and etching.

11. The elastic electric contact terminal of claim 1, wherein the core includes at least one channel formed downwardly from the top surface.

12. The elastic electric contact terminal of claim 11, wherein the polymer film includes a bridge extending over the channel.

13. The elastic electric contact terminal of claim 11, wherein the channel is formed in plurality with a support wall formed between the channels.

14. The elastic electric contact terminal of claim 13, wherein a top surface of the support wall is coupled to the polymer film with the adhesive layer disposed therebetween.

15. The elastic electric contact terminal of claim 11, wherein a both sidewalls of the channel are configured to tilt toward the channel when the elastic electric contact terminal is pressurized by an electrical object to support.

\* \* \* \* \*